(12) United States Patent
Yamaguchi et al.

(10) Patent No.: US 7,705,380 B2
(45) Date of Patent: Apr. 27, 2010

(54) AMPLIFICATION-TYPE SOLID-STATE IMAGE SENSING DEVICE

(75) Inventors: Tetsuya Yamaguchi, Tokyo (JP); Hiroshige Goto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 189 days.

(21) Appl. No.: 11/866,682

(22) Filed: Oct. 3, 2007

(65) Prior Publication Data
US 2008/0251822 A1  Oct. 16, 2008

(30) Foreign Application Priority Data
Oct. 4, 2006  (JP) .............................. 2006-273177

(51) Int. Cl.
H01L 31/062 (2006.01)
H01L 31/113 (2006.01)

(52) U.S. Cl. .............................. 257/292; 257/E27.133
(58) Field of Classification Search ................ 257/292, 257/E27.133
See application file for complete search history.

(56) References Cited

U.S. PATENT DOCUMENTS

| | | | | |
|---|---|---|---|---|
| 6,482,669 | B1 * | 11/2002 | Fan et al. ....................... | 438/70 |
| 6,545,331 | B1 * | 4/2003 | Miida .......................... | 257/431 |
| 6,727,521 | B2 * | 4/2004 | Merrill ......................... | 257/98 |
| 7,307,300 | B2 * | 12/2007 | Inoue .......................... | 257/291 |
| 7,345,703 | B2 * | 3/2008 | Lee ............................ | 348/272 |
| 7,459,735 | B2 * | 12/2008 | Ezaki et al. .................. | 257/292 |
| 2005/0173742 | A1 | 8/2005 | Ihara | |
| 2006/0219867 | A1 | 10/2006 | Yamaguchi et al. | |

FOREIGN PATENT DOCUMENTS

JP  2002-198507  7/2002
JP  2006-5265  1/2006

OTHER PUBLICATIONS

U.S. Appl. No. 12/408,214, filed Mar. 20, 2009, Sudo.

* cited by examiner

*Primary Examiner*—Thao X Le
*Assistant Examiner*—Geoffrey Ida
(74) *Attorney, Agent, or Firm*—Oblon, Spivak, McClelland, Maier & Neustadt, L.L.P.

(57) ABSTRACT

According to an aspect of the invention, there is provided an amplification-type solid-state image sensing device which uses a semiconductor substrate formed by epitaxially depositing an n-type semiconductor layer on a p-type semiconductor substrate and has a photoelectric conversion unit formed in the n-type semiconductor layer including a first p-type semiconductor layer which is formed under the photoelectric conversion unit of at least one of a G pixel portion and a B pixel portion a second p-type semiconductor layer which is formed to surround the photoelectric conversion unit together with the first p-type semiconductor layer and has a depth up to the first p-type semiconductor layer and a third p-type semiconductor layer which is formed to surround an R pixel portion and has a depth up to the p-type semiconductor substrate.

5 Claims, 7 Drawing Sheets

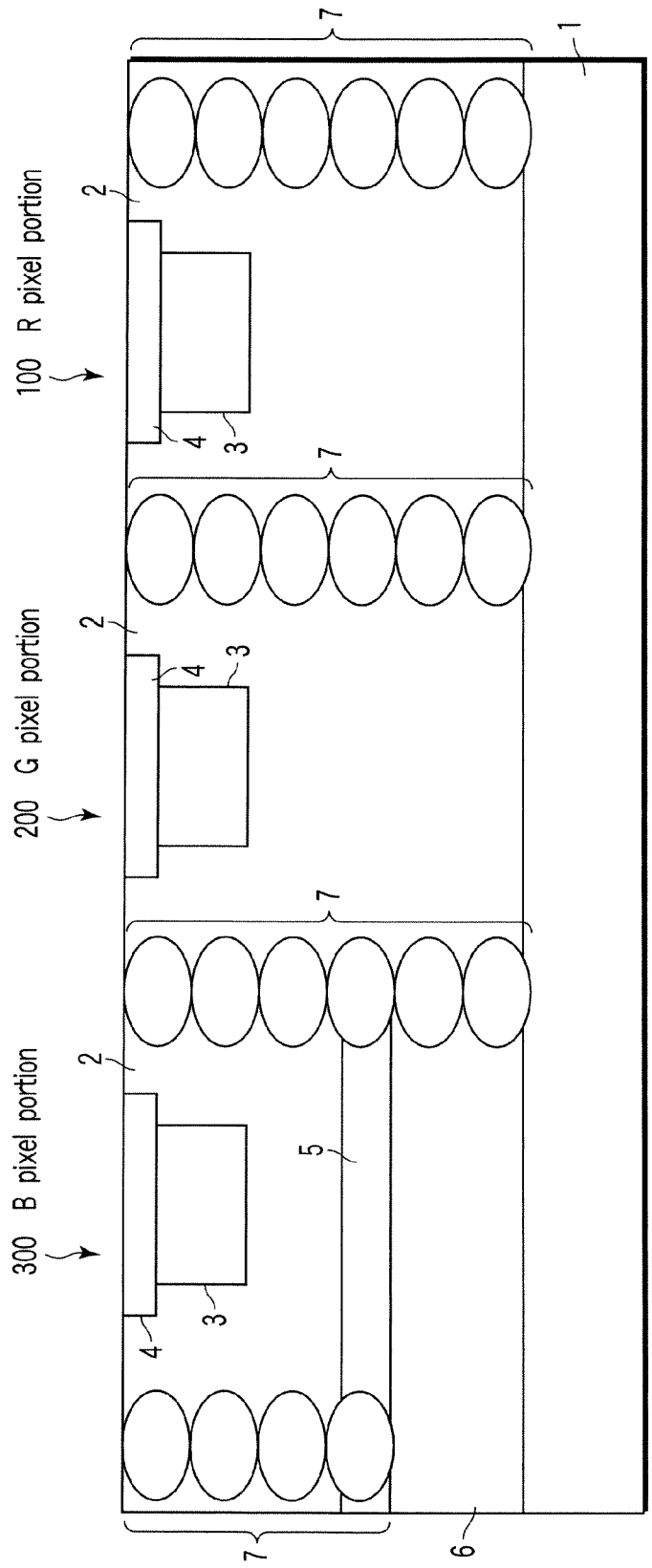
F I G. 4

AMPLIFICATION-TYPE SOLID-STATE IMAGE SENSING DEVICE

CROSS-REFERENCE TO RELATED APPLICATIONS

This application is based upon and claims the benefit of priority from prior Japanese Patent Application No. 2006-273177, filed Oct. 4, 2006, the entire contents of which are incorporated herein by reference.

BACKGROUND OF THE INVENTION

1. Field of the Invention

The present invention relates to an amplification-type solid-state image sensing device.

2. Description of the Related Art

Recently, amplification-type CMOS solid-state image sensing devices (CMOS image sensors) have become commercially available. The characteristic features of a CMOS image sensor are a single power supply, low-voltage driving (3 V), and low power consumption (about 50 mW). The CMOS image sensor includes photoelectric conversion elements and transistors arrayed on a single substrate and is also increasing the number of pixels and reducing the size, like a CCD. In the CMOS image sensor, signal charges generated by a photoelectric conversion element modulate the potential of a signal charge storage unit, and the potential modulates an amplification transistor in a pixel, thereby imparting an amplification function to the pixel.

A conventional CMOS image sensor uses a P/P$^+$ substrate in which a 5- to 10-μm-thick epitaxial layer of a P-type semiconductor layer containing B at a low concentration (e.g., $1 \times 10^{15}$ cm$^{-3}$) is formed on a base substrate (e.g., 1 to $3 \times 10^{18}$ cm$^{-3}$) (on the substrate surface side).

FIG. 6 is a sectional view near a photodiode (photoelectric conversion unit) portion of a CMOS image sensor formed by using a P/P$^+$ substrate. The CMOS image sensor uses a P/P$^+$ substrate because it can, e.g., shorten the lifetime of carriers (electrons) generated at a deep part of the substrate (in a region with a high B concentration). More specifically, even when strong light irradiates a photodiode 3 and generates carriers which are diffused to the deep part of the substrate, the electrons recombine in the region where the lifetime of carriers is short. Hence, the electrons are suppressed from leaking into the photodiode 3 adjacent to that irradiated with light through the deep part of the substrate. This suppresses blooming from the viewpoint of the characteristic of the device. A dark current from the deep part of the substrate can also be reduced. On the other hand, for example, a CCD conventionally uses an N substrate.

FIG. 7 is a sectional view near a photodiode portion of a CCD image sensing device formed by using an N substrate 10. B (boron) ions are implanted into the entire surface of the N substrate at, e.g., an acceleration voltage of 2.7 MV and a dose of 5E11 cm$^2$ without using a mask, thereby forming a flat p-well 8. The flat p-well 8 of a p-type semiconductor layer is formed at a depth of about 3 to 4 μm from the substrate surface. The photodiode 3 that executes photoelectric conversion is formed on the substrate surface side (about 1 μm). In addition, p-type semiconductor regions (barrier wells) 7 of B are generally formed between the adjacent photodiodes 3 to electrically isolate them from each other.

As described above, the conventional CCD image sensing device uses an N substrate. The flat p-well 8 and barrier wells 7 are formed under and near the photodiode 3. The device structure of the CCD image sensing device is designed (the concentration of the flat p-well 8 is adjusted) to move electrons to the substrate if strong light irradiates the photodiode 3, and generated electrons overflow from the photodiode 3. That is, since the structure of the N substrate allows to discard some of electrons generated upon irradiation of extremely strong light (e.g., sunlight), blooming can be suppressed.

However, the sensitivity of the N substrate is lower than that of the P/P$^+$ substrate because all electrons generated at a deep part of the substrate, e.g., electrons generated at a deeper position than the flat p-well 8 are discarded to the substrate. This especially results in a decrease in red sensitivity for long-wavelength light (red light) with a small absorption coefficient with respect to an Si substrate.

As described above, in a solid-state image sensing device using an N substrate, carriers (electrons) overflowed from the photodiode 3 can be discarded to the substrate. It is therefore easy to suppress blooming or color crosstalk. However, the N substrate is disadvantageous in size reduction of the element because the sensitivity is lower than that of a P/P$^+$ substrate. To solve the problem of low sensitivity, the CCD applies a high voltage (e.g., 5 V) to the photodiode to widen its depletion layer, thereby efficiently collecting carriers to the photodiode.

However, in an amplification-type solid-state image sensing device (CMOS image sensor) characterized in low-voltage driving, unlike a CCD, it is impossible to make the depletion layer of the photodiode so wide as that of the CCD, and the sensitivity is hard to improve. The technical problem of the CMOS image sensor is how to form a well structure to efficiently collect carriers to the photodiode.

To solve this problem, use of an N/P$^+$ substrate has been proposed. An N/P$^+$ substrate is formed by using the same P$^+$ substrate as the base substrate of the conventional P/P$^+$ substrate and epitaxially depositing an n-type semiconductor layer on it. Using the N/P$^+$ substrate, P (phosphorus) ions are implanted into the N epitaxial layer by an accelerator to form a photodiode (n-type semiconductor layer). In this case, the depletion layer of the photodiode widens as compared to the P/P$^+$ substrate. The region where the photodiode collects electrons can spread to the deep part side of the substrate so that the sensitivity can improve.

However, the structure with a solid-state image sensing device formed on a conventional P/P$^+$ substrate and the structure with a solid-state image sensing device formed on an N/P$^+$ substrate pose several technical problems. One problem is electrical isolation of the photodiodes. In the conventional P/P$^+$ substrate, the photodiodes (n-type semiconductor layers) 3 are formed in the p-type epitaxial layer, as shown in FIG. 6. Hence, the p-type semiconductor layer of a p-type epitaxial layer 9 isolates the adjacent photodiodes 3. In the N/P$^+$ substrate, however, since the photodiodes are formed in the n-type epitaxial layer, the photodiodes electrically connect to each other.

Additionally, the N/P$^+$ substrate cannot discard excess signal charges generated when, e.g., strong light irradiates the photoelectric conversion element, like a structure with a CMOS image sensor formed on a conventional P/P$^+$ substrate. Hence, even the N/P$^+$ substrate has the problems of blooming and color crosstalk, like the conventional P/P$^+$ substrate.

The above-described problem that a CMOS image sensor using an N/P$^+$ substrate or P/P$^+$ substrate cannot discard excess signal charges is posed because there is no place to discard the excess signal charges, although the structure of a CCD using an N substrate allows to discard excess signal charges to the substrate.

A technique disclosed in Jpn. Pat. Appln. KOKAI Publication No. 2006-5265 uses a $P^+/N/P$ substrate and forms an element isolation region adjacent to a photoelectric conversion element to suppress blooming.

Jpn. Pat. Appln. KOKAI Publication No. 2002-198507 discloses a technique of surrounding the side and lower surfaces of a sensor unit of a CCD solid-state image sensing device by a P-WELL to prevent color crosstalk.

BRIEF SUMMARY OF THE INVENTION

According to an aspect of the invention, there is provided an amplification-type solid-state image sensing device which uses a semiconductor substrate formed by epitaxially depositing an n-type semiconductor layer on a p-type semiconductor substrate and has a photoelectric conversion unit formed in the n-type semiconductor layer, comprising: a first p-type semiconductor layer which is formed under the photoelectric conversion unit of at least one of a G pixel portion and a B pixel portion; a second p-type semiconductor layer which is formed to surround the photoelectric conversion unit together with the first p-type semiconductor layer and has a depth up to the first p-type semiconductor layer; and a third p-type semiconductor layer which is formed to surround an R pixel portion and has a depth up to the p-type semiconductor substrate.

BRIEF DESCRIPTION OF THE SEVERAL VIEWS OF THE DRAWING

FIG. 4 is a sectional view showing another modification of the CMOS-type amplification-type solid-state image sensing device according to the embodiment;

DETAILED DESCRIPTION OF THE INVENTION

An embodiment will be described below with reference to the accompanying drawing.

Figure 1:
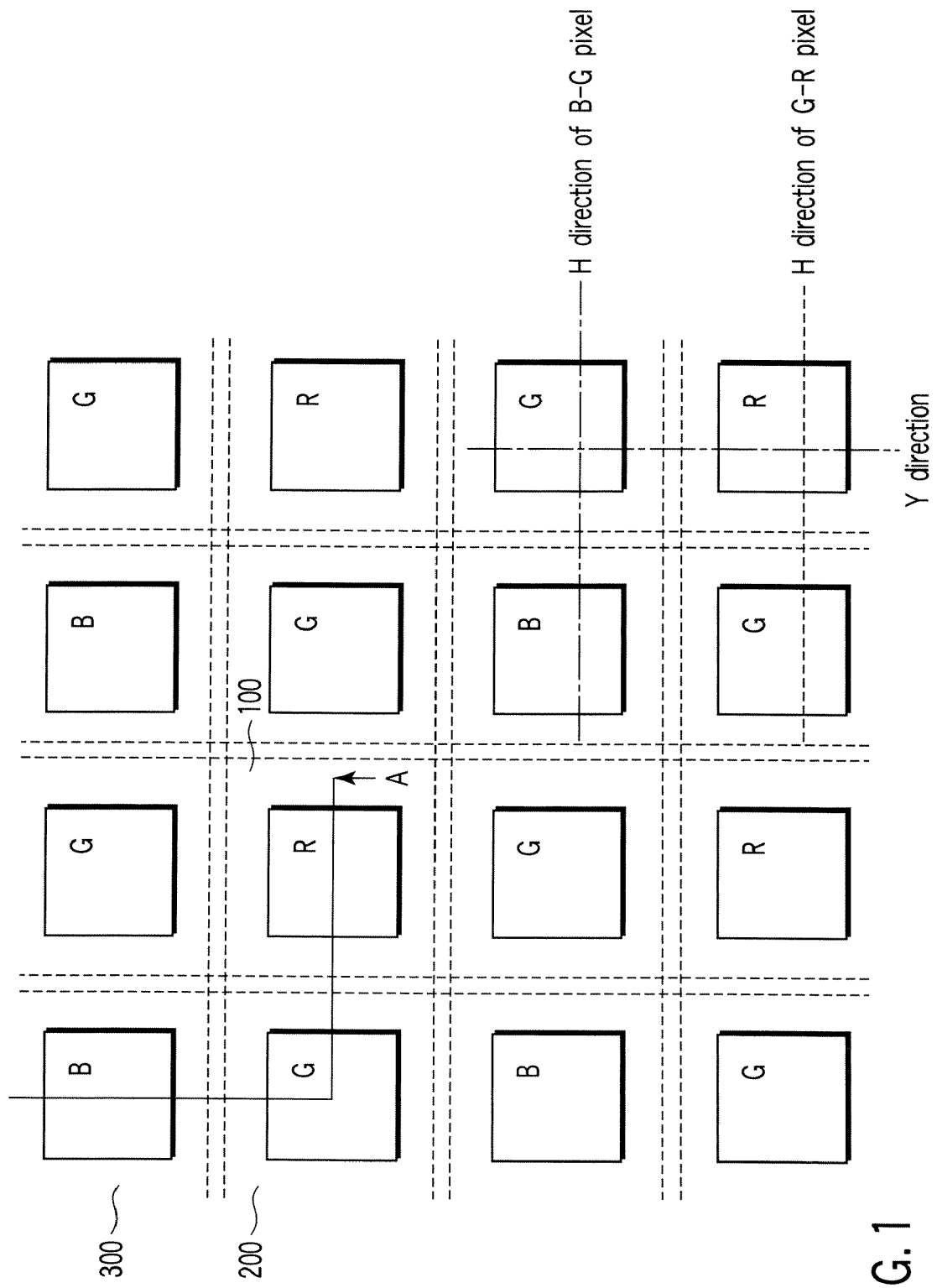
FIG. 1 is a plan view showing the layout of pixels of the respective colors in a CMOS-type amplification-type solid-state image sensing device (CMOS image sensor) according to an embodiment of the present invention.

FIG. 1 is a plan view showing the layout of pixels of the respective colors in an amplification-type CMOS solid-state image sensing device (CMOS image sensor) according to an embodiment of the present invention. Referring to FIG. 1, R (red), G (green), and B (blue) pixel portions 100, 200, and 300 are laid out in the H direction (horizontal direction) and V direction (vertical direction).

Figure 2:
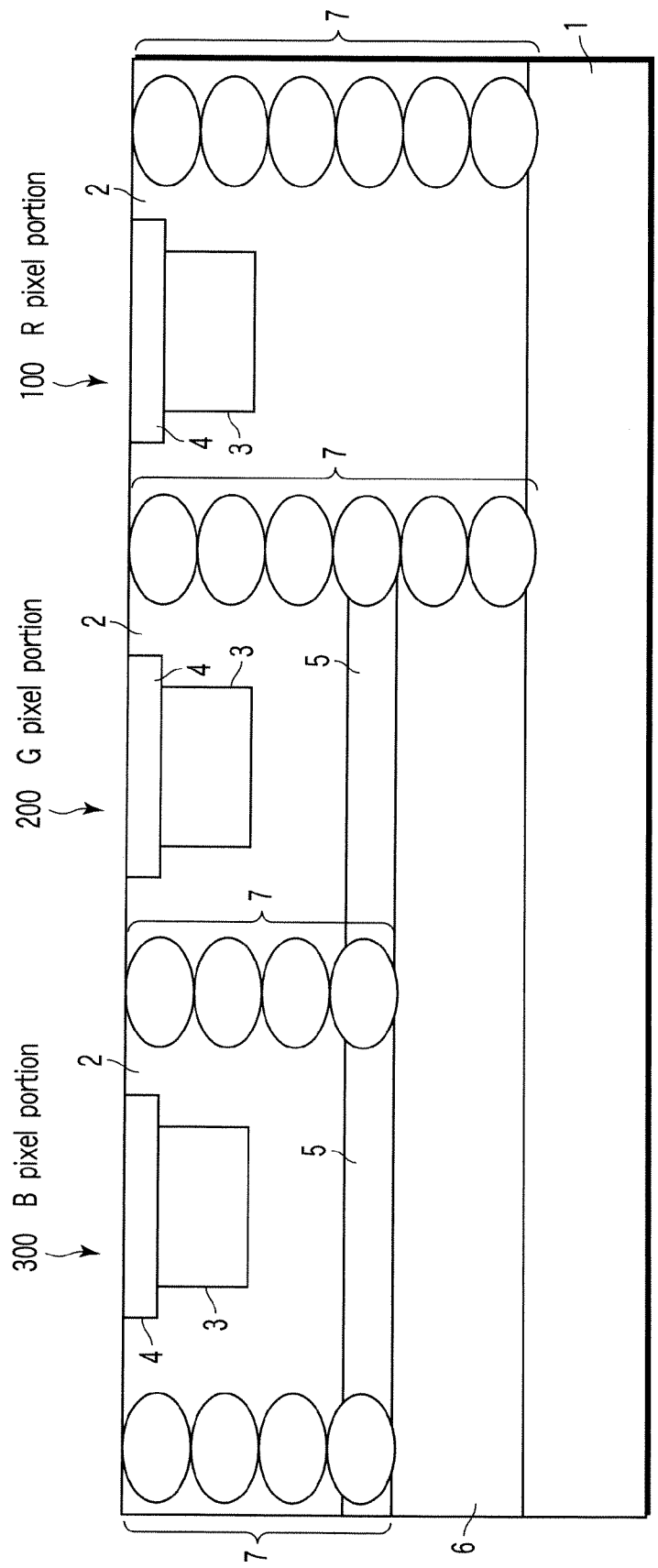
FIG. 2 is a sectional view taken along a line A-A in FIG. 1.

FIG. 2 is a sectional view taken along a line A-A in FIG. 1 FIG. 2 shows the sectional structure of the photodiode portion. As shown in FIG. 2, a 6-μm-thick n-type semiconductor layer (n-type impurity concentration P: $2\times10^{15}$ $cm^{-3}$) 2 is epitaxially deposited on a base substrate 1 (p-type semiconductor substrate) with a high B (boron) concentration (e.g., $2\times10^{18}$ $cm^{-3}$), thereby forming an $N/P^+$ substrate.

Photodiodes 3 each serving as a photoelectric conversion element are formed in the n-type semiconductor layer 2 by a conventional method. As an example of the photodiode forming method, P (phosphorus) ions are implanted at, e.g., an acceleration voltage of 310 KV and a dose of 1.3E12 $cm^2$ by using an accelerator. The peak depth of P concentration, which is mainly determined by the energy of P ion implantation, is about 0.4 μm from the surface.

A shield 4 is formed on and near each photodiode 3. In this case, B ions are implanted at a voltage of 10 KV and a dose of 5E13 $cm^2$. Consequently, the B concentration of the surface of the photodiode increases to $1\times10^{19}$ $cm^{-3}$.

When a conventional $P/P^+$ substrate is used, adjacent photodiodes (n-type semiconductor layers) are electrically isolated from each other even when they are formed on a p-type epitaxial layer (p-type semiconductor layer). In the $N/P^+$ substrate, however, the photodiodes are formed on an n-type epitaxial layer. If photodiodes are formed only by the conventional method, the adjacent photodiodes electrically connect to each other. If the photodiodes electrically connect to each other, electrons generated by photoelectric conversion cannot be the signal of a pixel that should be processed. This causes color crosstalk and degrades a reproduced image. For this reason, it is necessary to isolate the adjacent photodiodes.

For the purpose of electrically isolating the adjacent photodiodes 3 (element isolation), a resist is applied and patterned on a desired region (where an active region should be formed) so that a pattern is formed by leaving the resist. More specifically, the resist is removed from a region where an element isolation layer between the photodiodes should be formed.

After that, $B^+$ (boron ions) is implanted by an accelerator. When the ion implantation is executed several times at a desired acceleration energy and dose, a p-type semiconductor layer with a depth reaching the $P^+$ layer at the deep part of the base substrate 1 can be formed. That is, an element isolation layer 7 between the adjacent photodiodes 3 is formed. More specifically, the element isolation layer is formed by ion-implanting $B^+$ several times at acceleration voltages of 200 KV and 400 KV and a dose of 1E12 $cm^2$ after the resist patterning.

With the $B^+$ ion implantation, a p-type semiconductor layer is formed on the side surface of each photodiode. Then, the resist is temporarily removed by, e.g., ashing (e.g., oxygen radical process). A resist is applied and patterned again to implant B ions to regions under the photodiodes 3 of the G pixel portions 200 and B pixel portions 300 and regions between the photodiodes of the R pixel portions 100, G pixel portions 200, and B pixel portions 300. The pattern formed by this patterning is designed to ion-implant B into the region (element isolation layer) around the photodiode of each R pixel portion 100 but not into the region under it. After this, $B^+$ ion implantation is executed at a voltage of 700 KV and a dose of 1E12 $cm^2$.

As a result, p-type semiconductor layers (p-type semiconductor layers formed under the photodiodes: Bottom_P) 5 are formed by ion implantation under the photodiodes of the B pixel portions 300 and G pixel portions 200. The p-type semiconductor layers 5 connect to each other in the image sensing region. Hence, in each of the B pixel portions 300 and G pixel portions 200, the p-type semiconductor layer 7 formed on the side surface of the photodiode 3 and the p-type semiconductor layer 5 formed under it surround the photodiode 3. That is, the p-type semiconductor layer 7 formed on the side surface of the photodiode 3 of each of the B pixel portions 300 and G pixel portions 200 has a depth up to the p-type semiconductor layer 5.

Then, a resist is applied and patterned again to form a p-type semiconductor layer to surround only the photodiode 3 of each R pixel portion 100. For example, B$^+$ ions are implanted at a voltage of 1,200 KV and a dose of 1E12 cm$^2$. As a result, the p-type semiconductor layer 7 surrounds all side surfaces (the photodiode element isolation portions of the R pixel portion) of the photodiode 3 of each R pixel portion 100 while the p-type semiconductor layer formed by B diffusion from the base substrate 1 surrounds the bottom portion of the n-type semiconductor layer 2 in which the photodiode 3 is formed. That is, the p-type semiconductor layer 7 surrounding the photodiode 3 of each R pixel portion 100 has a depth up to the base substrate 1.

Consequently, the n-type semiconductor layer 2 with the photodiode 3 of the each R pixel portion 100 can be formed up to a deeper part of the substrate as compared to the n-type semiconductor layers 2 with the photodiodes 3 of the G pixel portion 200 and B pixel portion 300. That is, the structure of the photodiode region in the depth direction of the substrate can change between the R pixel portion 100, the G pixel portion 200, and the B pixel portion 300.

Figure 3:
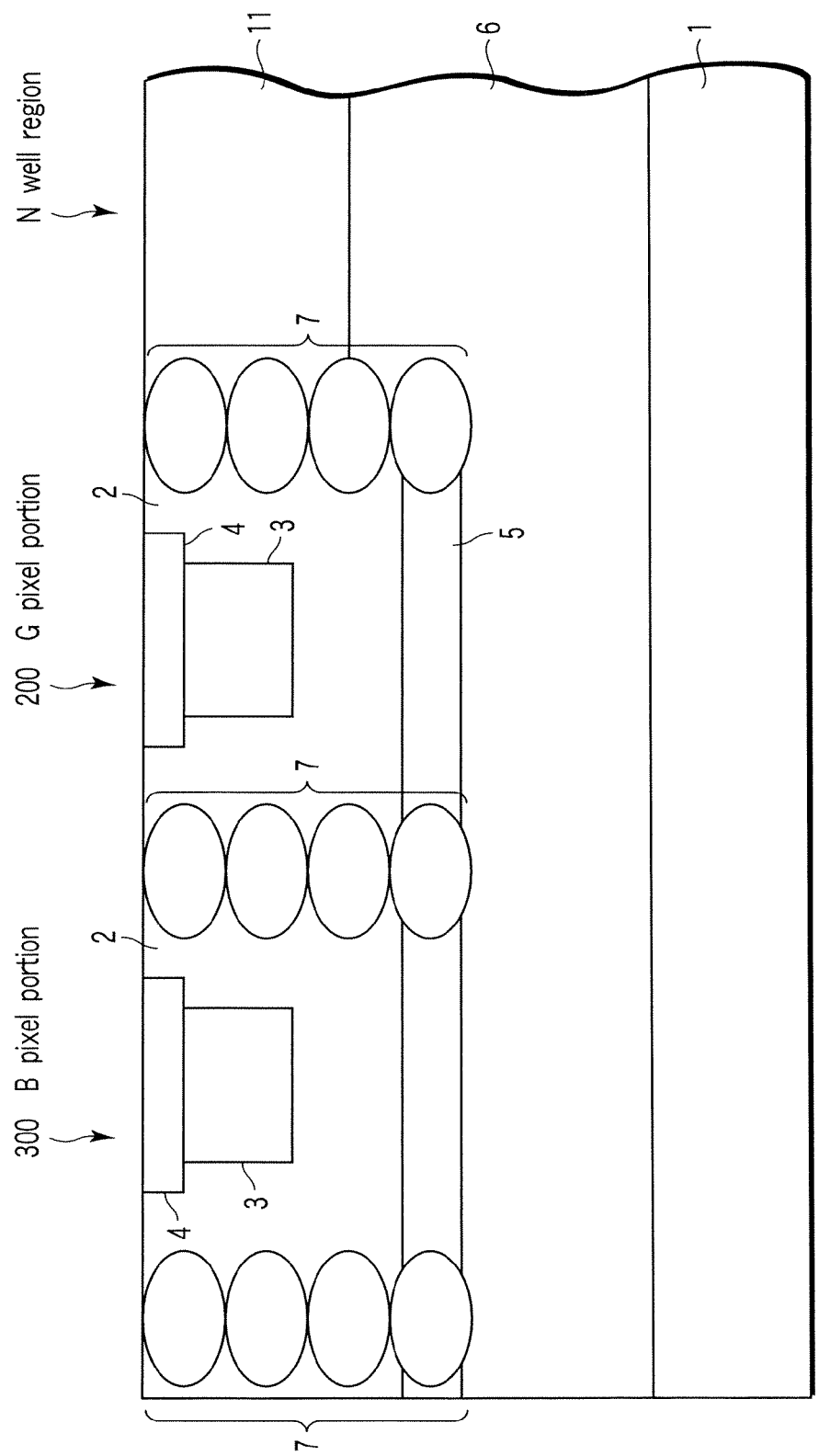
FIG. 3 is a sectional view showing a modification of the CMOS-type amplification-type solid-state image sensing device according to the embodiment.

In this way, the p-type semiconductor layer 5 is formed under the photodiode 3 of each of the G pixel portions 200 and B pixel portions 300 by ion implantation for element isolation or the like. An n-type semiconductor layer (to be referred to as an N epitaxial OFD 6 hereinafter) originated from an N epitaxial layer remains at a deeper part of the substrate than the p-type semiconductor layer 5 (under the p-type semiconductor layer 5). As shown in FIG. 3, when the N epitaxial OFD 6 electrically connects to a voltage-applicable n-type semiconductor layer 11 such as an N well region formed around the image sensing region, a voltage can be applied to the N epitaxial OFD 6. The N epitaxial OFD 6 can form an overflow drain structure. That is, the N epitaxial OFD 6 forms a structure to discard electrons overflowed from the photodiode 3.

The p-type semiconductor layer 5 is preferably formed under the photodiode 3 of each of the G pixel portions 200 and B pixel portions 300 which are arrayed in a Bayer matrix. This is because when the N epitaxial OFD 6 is formed under the p-type semiconductor layer 5 of each of the G pixel portions 200 and B pixel portions 300, it is unnecessary to form a p-type semiconductor layer aiming at element isolation between the G pixel portions 200 and B pixel portions 300 at a deeper part of the substrate than the p-type semiconductor layer 5, and the N epitaxial OFDs 6 under the G pixel portions 200 and B pixel portions 300 can easily electrically connect to each other.

The p-type semiconductor layer 5 under the photodiode of each of the G pixel portions 200 and B pixel portions 300 can also be formed by using part of the ion implantation process for element isolation between the photodiodes.

In this embodiment, the p-type semiconductor layer 5 is formed under the photodiode 3 of each of the G pixel portions 200 and B pixel portions 300. The p-type semiconductor layer 5 may be formed only under the photodiode 3 of each B pixel portion 300 as shown in FIG. 4. In this case, however, the N epitaxial OFD 6 formed under the p-type semiconductor layer 5 of each B pixel portions 300 floats. This structure cannot discard excess carriers. That is, the structure cannot have the OFD function.

To solve this problem, for the N epitaxial OFD formed under the p-type semiconductor layer 5 of each B pixel portion 300, for example, P (phosphorus) ions may additionally be implanted into the drain portion of a reset transistor several times at high energy (e.g., at voltages of 400 KV, 800 KV, 1.2 MV, 1.6 MV, and 2.0 MV and a dose of 1E12 cm$^2$) so that the drain electrically connects to the N epitaxial OFD formed at the deep part of the B pixel portion 300.

It is also possible to form the p-type semiconductor layers 5 under the photodiodes 3 of all the R pixel portions 100, G pixel portions 200, and B pixel portions 300. The N epitaxial OFDs 6 formed at a deeper part of the substrate than the p-type semiconductor layers 5 can electrically connect to each other in the image sensing region. This is supposed to enhance the overflow drain function of the N epitaxial OFD 6. However, in this case, the depth of formation of the p-type semiconductor layer 5 determines the depth of the photodiode region of each R pixel portion 100. For this reason, the photodiode region becomes shallower than that of the R pixel portion 100 formed by the method of this embodiment (the depth of the photodiode region of the R pixel portion 100 is defined by B diffusion from the base substrate 1) shown in FIG. 2. This is supposed to slightly decease the R sensitivity.

Additionally, to facilitate voltage application to the N epitaxial OFD 6 with the overflow drain function according to this embodiment, the resistance of the N epitaxial OFD 6 may be reduced by implanting, into the substrate, ion of an element (e.g., P or As) to form an n-type semiconductor layer.

Figure 5:
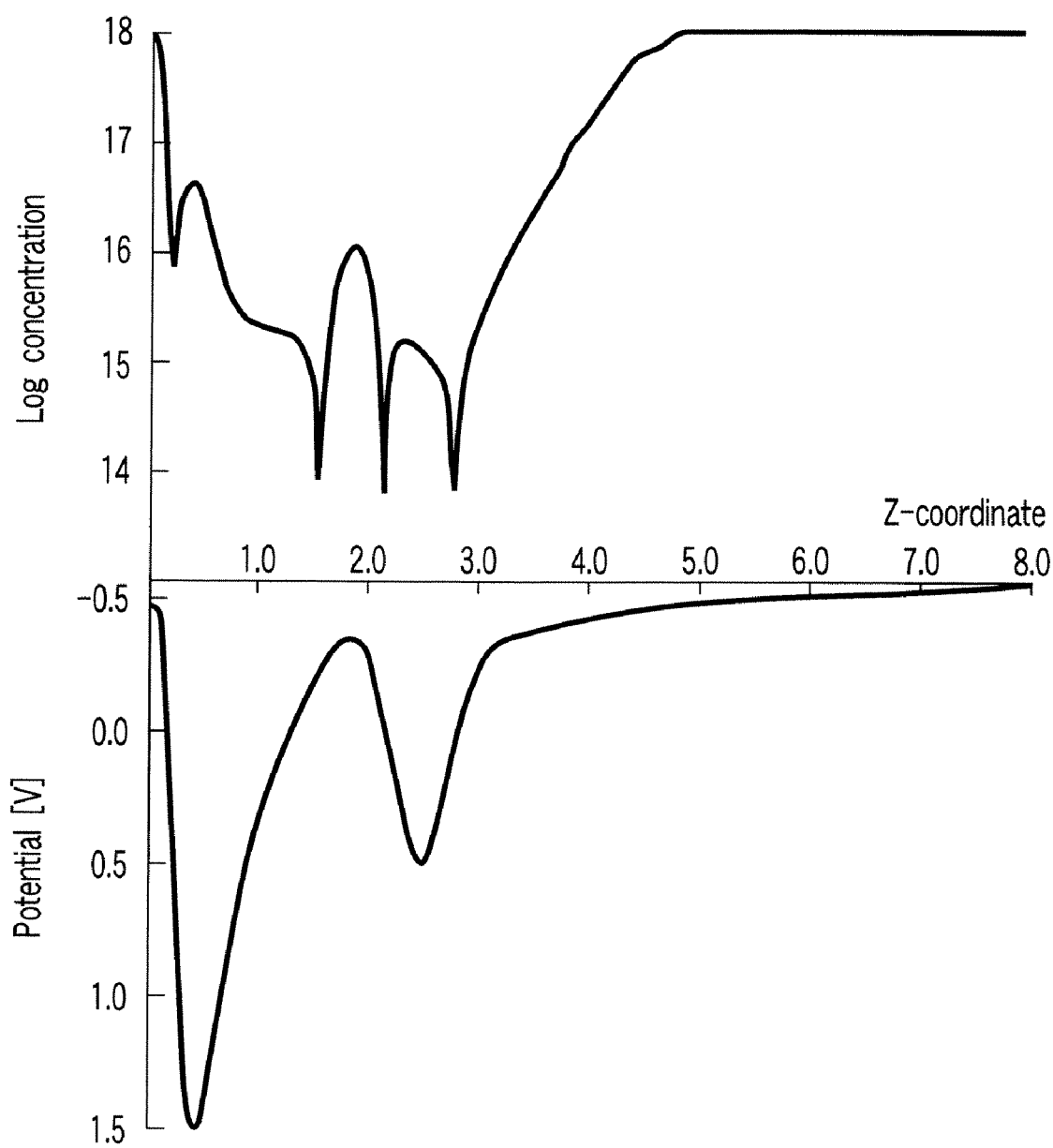
FIG. 5 is a graph showing the impurity concentration distribution and potential distribution of a photodiode portion of an R pixel portion according to the embodiment.
Figure 6:
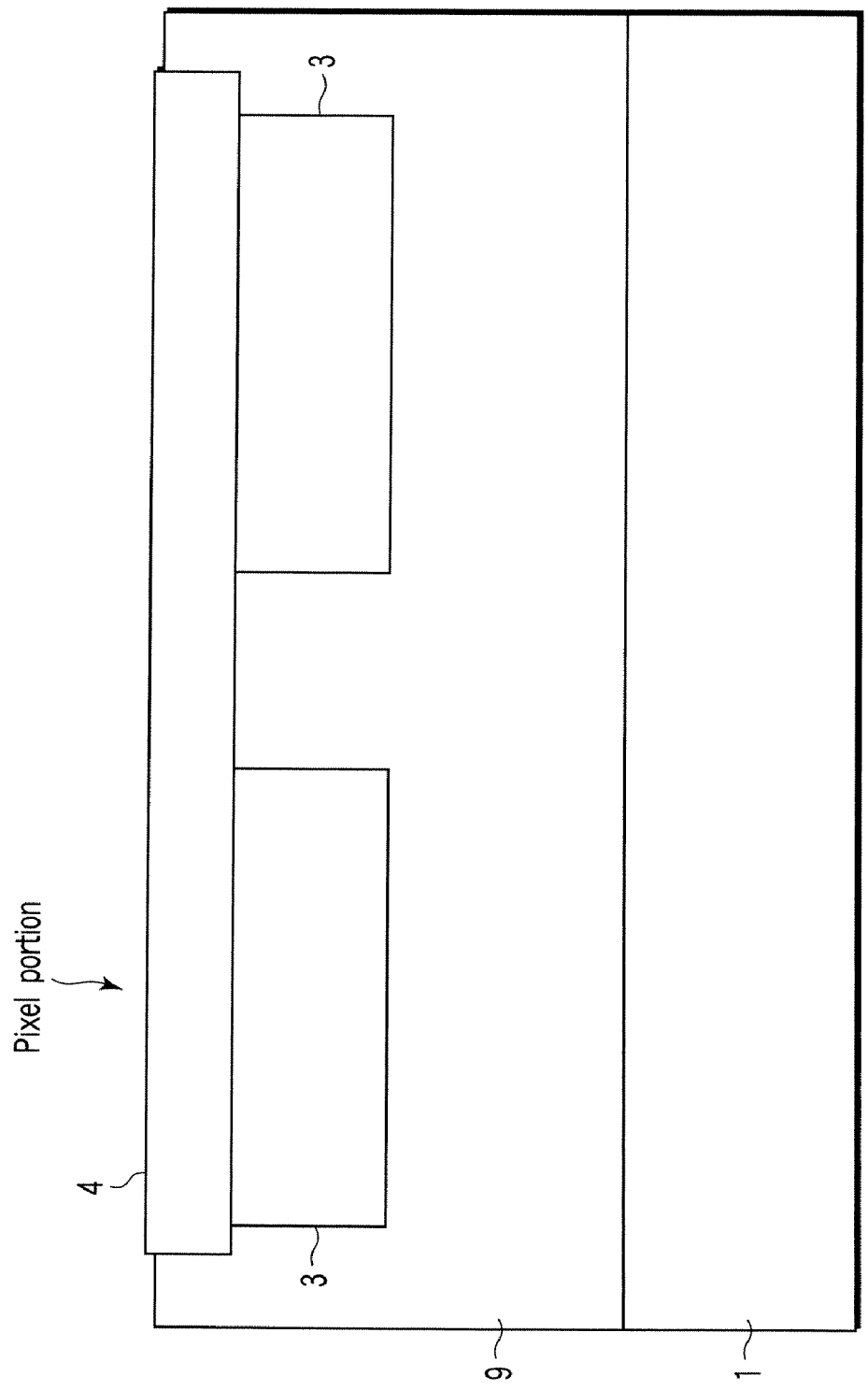
FIG. 6 is a sectional view near a photodiode portion of a CMOS image sensor formed by using a conventional $P/P^+$ substrate.
Figure 7:
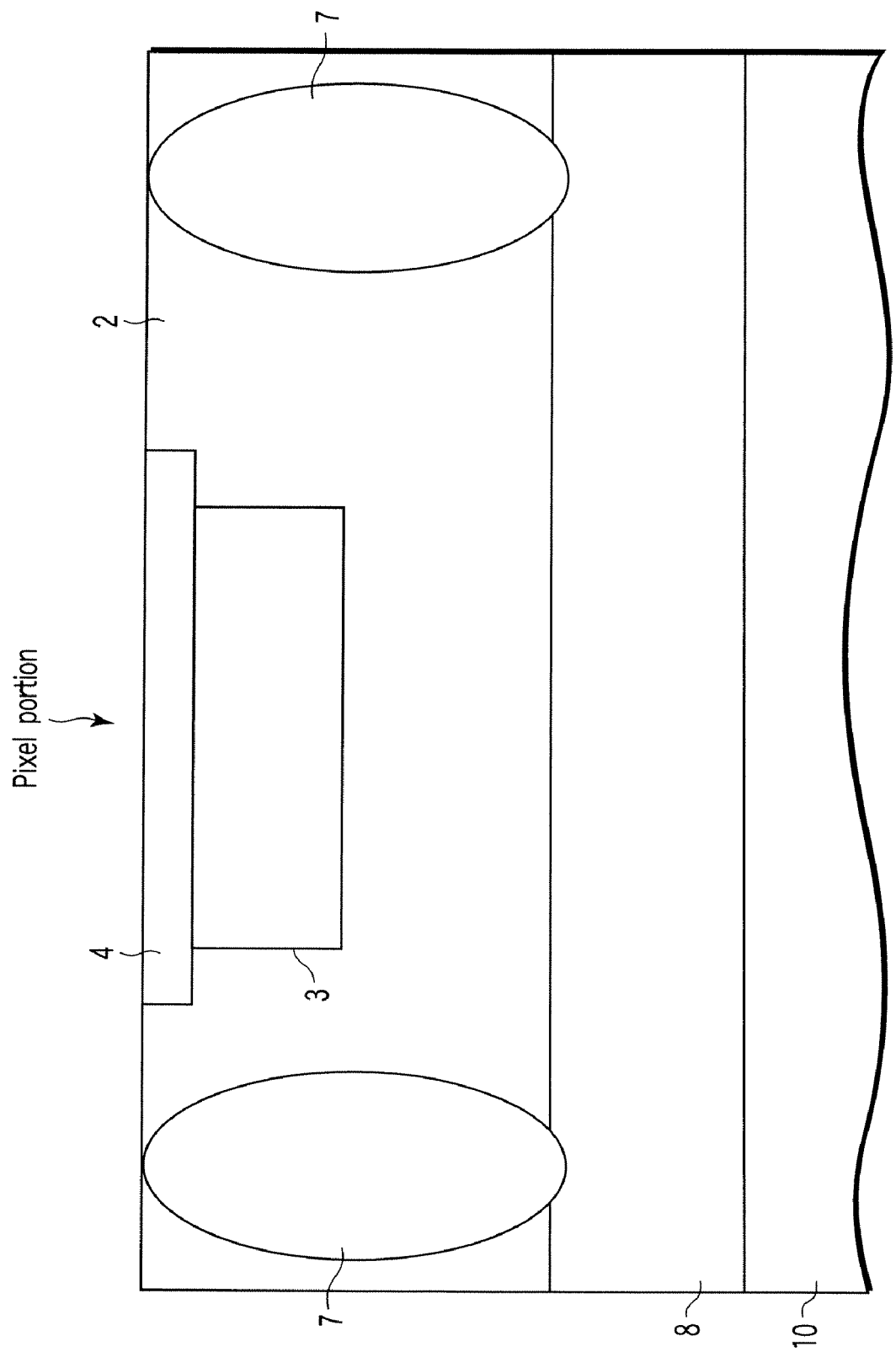
FIG. 7 is a sectional view near a photodiode portion of a CCD image sensing device formed by using a conventional N substrate.

FIG. 5 is a graph showing the impurity concentration distribution and potential distribution of the photodiode portion of the R pixel portion 100 according to this embodiment. As shown in FIG. 5, the impurity concentrations of B and P in the depth direction of the photodiode portion 3 exhibit a profile that allows a p-type semiconductor layer formed by a flat p-well 8 at a depth of about 2 μm from the substrate surface to electrically isolate the photodiode 3 (n-type semiconductor layer) on the substrate surface side from the N epitaxial OFD 6 (n-type semiconductor layer). This impurity profile structure makes electrons generated at a deeper part than the flat p-well 8 flow into the N epitaxial OFD 6. Since the electrons are discarded, they never leak into adjacent photodiodes and cause color crosstalk.

The embodiment of the present invention provides an amplification-type solid-state image sensing device which can discard excess signal charges and consequently reduce color crosstalk and suppress blooming so that the color reproducibility improves.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An amplification-type solid state image sensing device which uses a semiconductor substrate formed by epitaxially depositing an n-type semiconductor layer on a p-type semiconductor substrate and has photoelectric conversion units formed in the n-type semiconductor layer, comprising:
   first p-type semiconductor layers which are formed under the photoelectric conversion units of green and blue pixel portions;
   second p-type semiconductor layers which are formed to surround the photoelectric conversion units of the green and blue pixel portions together with the first p-type semiconductor layers and have a depth up to the first p-type semiconductor layers; and a third p-type semiconductor layer which is formed to surround a red pixel portion and has a depth up to the p-type semiconductor substrate, wherein portions of the n-type semiconductor layer existing under the first p-type semiconductor layers formed under the photoelectric conversion units of the green and blue pixel portions are electrically connected to each other and are electrically connected to an n-type semiconductor layer formed around an image sensing region.

2. The device according to claim 1, wherein the green pixel portion and the blue pixel portion are arrayed in a Bayer matrix.

3. The device according to claim 1, further comprising a structure which applies a voltage to the n-type semiconductor layer formed on the p-type semiconductor substrate.

4. The device according to claim 3, wherein the structure comprises the n-type semiconductor layer formed around the image sensing region, through which the voltage is applied to the n-type semiconductor layer formed on the p-type semiconductor substrate.

5. The device according to claim 1, wherein the second p-type semiconductor layer includes boron.

* * * * *